United States Patent [19]
Yamauchi et al.

[11] Patent Number: 5,172,199
[45] Date of Patent: Dec. 15, 1992

[54] COMPACT NONVOLATILE SEMICONDUCTOR MEMORY DEVICE USING STACKED ACTIVE AND PASSIVE ELEMENTS

[75] Inventors: Yoshimitsu Yamauchi, Yamatokoriyama; Kenichi Tanaka, Narashi; Keizo Sakiyama, Kashihara, all of Japan

[73] Assignee: Sharp Kabushiki Kaisha, Osaka, Japan

[21] Appl. No.: 711,056

[22] Filed: Jun. 6, 1991

[30] Foreign Application Priority Data

Jun. 25, 1990 [JP] Japan .................................. 2-168101

[51] Int. Cl.$^5$ ...................... H01L 29/68; H01L 29/34; H01L 27/02; G11C 11/34
[52] U.S. Cl. .................................. 257/306; 365/185; 365/104; 257/379; 257/530
[58] Field of Search ........................... 357/23.5, 54, 51; 365/185

[56] References Cited

U.S. PATENT DOCUMENTS 4,881,114 11/1989 Mohsen et al. ........................ 357/54

FOREIGN PATENT DOCUMENTS 27681 2/1980 Japan ................................. 357/54 M
2-40960 9/1990 Japan .................................. 365/185

Primary Examiner—Rolf Hille
Assistant Examiner—Robert Limanek
Attorney, Agent, or Firm—Nixon & Vanderhye

[57] ABSTRACT

A nonvolatile semiconductor memory device including a semiconductor substrate, a pair of impurity diffusion regions provided in the substrate, a gate region provided between the pair of impurity diffusion regions, a first gate electrode stacked on the gate region via a first dielectric film, and a second gate electrode stacked on the first gate electrode via a second dielectric film, the first gate electrode being electrically short-circuited to one of the impurity diffusion regions.

5 Claims, 2 Drawing Sheets

COMPACT NONVOLATILE SEMICONDUCTOR MEMORY DEVICE USING STACKED ACTIVE AND PASSIVE ELEMENTS

BACKROUND OF THE INVENTION

1. Field of the Invention

This invention relates to semiconductor memory device and, more specifically to a nonvolatile semiconductor memory device of the programmable type.

2. Prior Arts

Among various types of a nonvolatile semiconductor memory device, a so-called One Time Programmable ROM (OTP-ROM) has conventionally been in wide use and which allows writing of a program on the basis of break down or non break down of a dielectric film. (See Japanese Unexamined publications Nos. 224355/1988, 306653/1988 and 77957/1989).

Such an OTP-ROM typically comprises, as shown in FIG. 4, a combination of one transistor (A) of the field effect type (FET) with one capacitor (B). Specifically, the capacitor (B) is formed on a drain diffusion region of the transistor (A). A program can be written to the OTP-ROM on the basis of break down or non break down of a dielectric film of the capacitor (B).

The above-noted conventional OTP-ROM has, however, a problem of rather limited integration in integrating a number of memory devices within a limited area of a substrate, because the transistor (A) and the capacitor (B) are disposed in substantially side-by-side relation. Thus, this problem has been a serious obstacle in realizing a large-capacity ROM.

SUMMARY OF THE INVENTION

The present invention is accomplished in view of the above circumstances, and an object thereof is to provide a nonvolatile semiconductor memory device of the OTP type with which a ROM of a far larger storage capacity can be easily realized.

Thus, the present invention provides a nonvolatile semiconductor memory device comprising a semiconductor substrate, a pair of impurity diffusion regions provided in the substrate, a gate region provided between the pair of impurity diffusion regions, a first gate electrode stacked on the gate region via a first dielectric film, and a second gate electrode stacked on the first gate electrode via a second dielectric film, the first gate electrode being electrically short-circuited to one of the impurity diffusion regions.

DETAILED DESCRIPTION OF THE PREFERRED EMBODIMENT

A nonvolatile semiconductor memory device of the invention has a stacked gate-electrode structure wherein one of the two impurity diffusion regions electrically connects to a first electrode so as to break down a dielectric film interposed between the stacked electrodes for allowing writing of a program.

With the above arrangement, when an overvoltage is applied between the second gate electrode and the impurity diffusion regions, the overvoltage is also applied to the first and second gate electrodes due to short-circuit between the first gate electrode and one of the impurity diffusion regions, whereby a dielectric break down occurs at the second dielectric film. When a voltage for reading is applied to the second gate electrode of the device in which a dielectric break down has occurred, the voltage is applied to the first gate electrode. As a result, current appears at the other impurity diffusion region because of transistor characteristics.

Now, an embodiment of the invention is described in detail with reference to the drawings.

Figure 1:
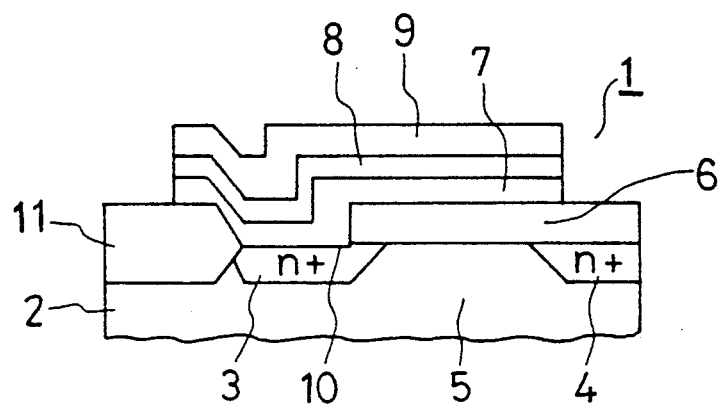
FIG. 1 is a sectional view schematically illustrating an embodiment of a nonvolatile semiconductor memory device according to the invention.

Referring to FIG. 1, a nonvolatile semiconductor memory device 1 incorporates a pair of n+impurity diffusion regions 3 and 4 provided in the top surface of a semiconductor substrate and a gate region 5 defined between the impurity diffusion regions 3 and 4. On the gate region 5 formed is a first gate electrode 7 of a polysilicon via a first dielectric film 6. A second electrode 9 of a polysilicon is stacked up on the first gate electrode 7 via a second dielectric film 8. The dielectric film formed on a connection portion 10 of one diffusion region 3 is removed so as to electrically connect (short-circuit) the region 3 to the first gate electrode 7. A field oxide 11 constitutes a device isolation region.

Here, the first dielectric film 6 is made of $SiO_2$, while the second dielectric film 8 is made of SiN or $SiO_2$/SiN. However, any suitable materials known in the art may be used for the first and second dielectric films provided that the material for the second dielectric film 8 is more susceptible to dielectric break down than the material for the first dielectric film 6. Because the second dielectric film 8 functions as a programmable dielectric film in the device. The thickness of each of the dielectric films varies with the size of the transistor. In accordance with the actual design rule, however, it may be convenient to set the thickness of the first dielectric film 6 preferably to 100–100 Å ($SiO_2$ equivalent) and that of the second dielectric film 8 preferably to about 50 Å ($SiO_2$ equivalent).

Figure 2:
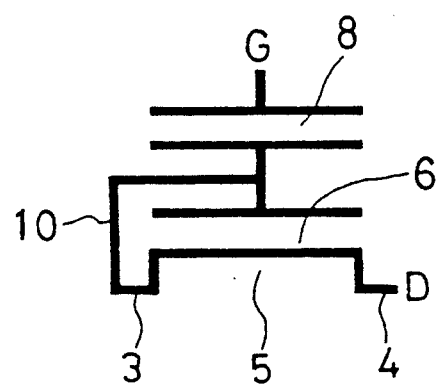
FIG. 2 is an equivalent circuit diagram of the embodiment shown in FIG. 1.

The nonvolatile semiconductor memory device 1 thus configured is, as shown in an equivalent circuit of FIG. 2, a two-terminal device in which the second gate electrode 9 functions as an apparent gate while the other diffusion region 4 functions as a drain.

Figure 3:
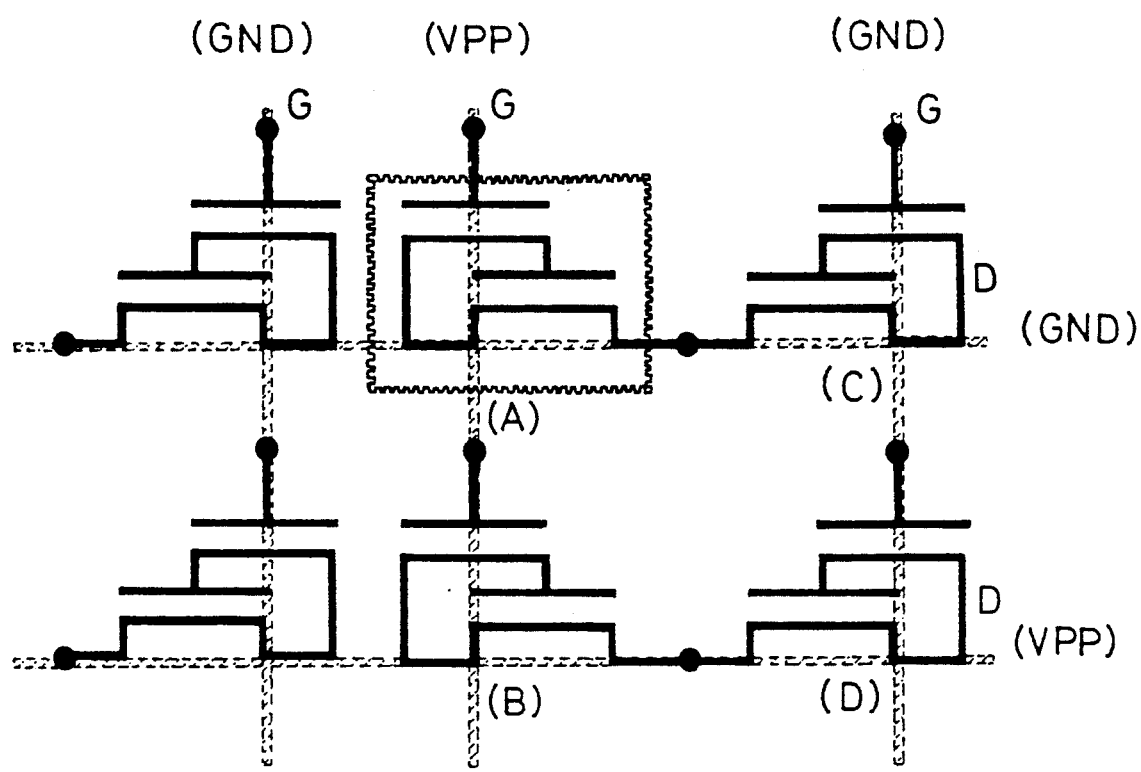
FIG. 3 is an explanatory diagram schematically illustrating the way how a program is written to a memory composed of a plurality of the memory devices of the embodiment.
Figure 4:
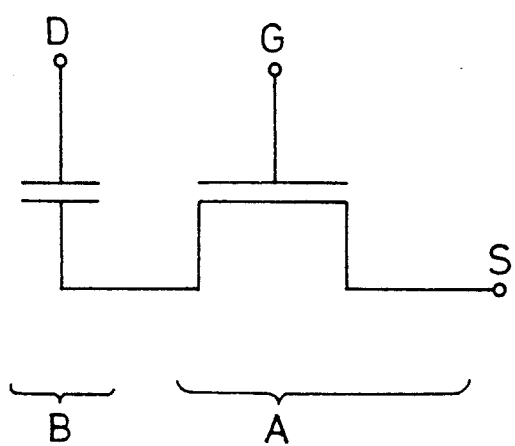
FIG. 4 is an equivalent circuit diagram of a conventional nonvolatile semiconductor memory device.

Next described is the way a program is written to the semiconductor memory devices of the invention with reference to FIG. 3.

FIG. 3 illustrates a memory in which a plurality of the semiconductor memory devices of the invention are combined. The semiconductor memory devices A, B, C and D are imparted with respective four combination patterns of gate bias voltage and drain bias voltage. The following Table 1 shows a relationship between the combination patterns and the voltage applied to the second dielectric film 8 (programmable dielectric film).

TABLE 1

| DEVICE | GATE G | DRAIN D | VOLTAGE APPLIED TO THE PROGRAMMABLE DIELECTRIC FILM |
|---|---|---|---|
| (A) | Vpp | GND | Vpp |
| (B) | Vpp | Vpp | 0 |
| (C) | GND | GND | 0 |
| (D) | GND | Vpp | 0 |

It can be understood from Table 1 that the voltage Vpp is applied to the programmable dielectric film only in the case of the combination (A), whereby a dielectric break down occurs in the dielectric film. The combinations (B), (C) and (D) do not cause voltage to be applied to the programmable dielectric film, so that a dielectric break down does not occur in the film. Hence, when the gate voltage is applied afterward, current flows between the gate G and drain D of the device (A), while it does not flow between the gate G and drain D of the devices (B), (C) and (D). In this way, a program can be written on the basis of combination of these memory devices.

Accordingly, the nonvolatile semiconductor memory device of the invention allows writing of a program without a capacitor which is indispensable to a conventional memory device. Hence, it allows a higher integration as compared with the case of using conventional memory devices and realizes a memory of larger capacity.

While the present invention has been described with reference to the preferred embodiment thereof, it will be understood by those skilled in the art that various modifications may be made without departing from the spirit or scope of the invention

What is claimed is:

1. A nonvolatile semiconductor memory device comprising:
    a semiconductor substrate,
    a pair of impurity diffusion regions provided in the substrate,
    a gate region provided between the pair of impurity diffusion regions,
    a first gate electrode formed on the gate region via a first dielectric film,
    a second gate electrode stacked upon the first gate electrode via a second dielectric film,
    the first gate electrode being electrically short-circuited to one of the impurity diffusion regions, and
    the second dielectric film having a lower breakdown voltage than said first dielectric film.

2. A device as in claim 1, wherein the first gate electrode and the second gate electrode are each formed of polysilicon.

3. A device as in claim 1, wherein the first dielectric film is formed of $SiO_2$, while the second dielectric film is formed of SiN or $SiO_2$ or $SiO_2SiN$.

4. A nonvolatile integrated circuit semiconductor memory comprising an array of memory cells, each said memory cell comprising:
    an active device comprising a MOSFET constructed to have a first breakdown voltage, and
    a passive device comprising a capacitor constructed within approximately the same integrated circuit footprint area as said active device, said passive device using at least one insulating layer having a second breakdown voltage which is substantially less than said first breakdown voltage.

5. A nonvolatile integrated circuit semiconductor memory comprising an array of memory cells, each said memory cell comprising:
    an active device constructed to have a first breakdown voltage,
    a passive device constructed within approximately the same integrated circuit footprint area as said active device, said passive device using at least one insulating layer having a second breakdown voltage which is substantially less than said first breakdown voltage, and
    wherein said active device comprises a MOSFET having a gate insulation layer of a first thickness and said passive device comprises a capacitor disposed directly above said MOSFET and having an inter-electrode insulation layer less than half said first thickness.

* * * * *